(12) United States Patent
Maidee

(10) Patent No.: US 9,653,165 B2
(45) Date of Patent: May 16, 2017

(54) MULTIPLEXER-BASED TERNARY CONTENT ADDRESSABLE MEMORY

(71) Applicant: Xilinx, Inc., San Jose, CA (US)

(72) Inventor: Pongstorn Maidee, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/675,159

(22) Filed: Mar. 31, 2015

(65) Prior Publication Data

US 2016/0293255 A1     Oct. 6, 2016

(51) Int. Cl.
*G11C 15/00*     (2006.01)
*G11C 15/04*     (2006.01)

(52) U.S. Cl.
CPC .............. *G11C 15/04* (2013.01); *G11C 15/00* (2013.01); *G11C 15/046* (2013.01)

(58) Field of Classification Search
CPC ..... G11C 15/00; G11C 7/1048; G11C 7/1072; G11C 7/1012; G06F 17/30982; G06F 7/74
See application file for complete search history.

(56) References Cited

U.S. PATENT DOCUMENTS

| | | | | |
|---|---|---|---|---|
| 5,588,010 A * | 12/1996 | Hardell, Jr. | ........... | H03M 13/00 714/752 |
| 6,806,732 B1 | 10/2004 | Kaviani | | |
| 7,308,470 B2 * | 12/2007 | Ng | ........................ | G06F 7/5336 708/628 |
| 7,853,578 B1 * | 12/2010 | Anker | ........................ | G06F 7/02 707/706 |
| 9,367,645 B1 * | 6/2016 | Gazit | ........................ | G06F 12/00 |
| 2006/0155915 A1 * | 7/2006 | Pereira | ........................ | H04L 45/00 711/100 |
| 2007/0028039 A1 * | 2/2007 | Gupta | ........................ | G11C 15/00 711/108 |

(Continued)

OTHER PUBLICATIONS

Ullah, Zahid et al., Hybrid Partitioned SRAM-Based Ternary Content Addressable Memory, IEEE Transactions on Circuits and Systems—I : Regular Papers, vol. 59, No. 12, pp. 2969-2979, Dec. 2012.

(Continued)

*Primary Examiner* — Son Dinh
*Assistant Examiner* — Uyen B Tran
(74) *Attorney, Agent, or Firm* — Robert M. Brush; Keith Taboada

(57) ABSTRACT

In one example, a ternary content addressable memory (TCAM) includes an input port coupled to receive a W-bit key as input, and an output port coupled to provide a match vector as output, the match vector including at least one bit. The TCAM further includes a memory having memory cells operable to store N*W pairs of bits for N W-bit TCAM words. The memory includes a plurality of memory outputs. The TCAM further includes at least one compare circuit. The at least one compare circuit includes at least one multiplexer each coupled to receive as input a true version and a complement version of a bit of the W-bit key. Each of the at least one multiplexer is controlled by a respective pair of memory outputs of the plurality of memory outputs. The at least one compare circuit further includes combinatorial logic coupled to perform at least one logical AND operation based on output of the at least one multiplexer.

15 Claims, 10 Drawing Sheets

(56) References Cited

U.S. PATENT DOCUMENTS

| | | | | |
|---|---|---|---|---|
| 2007/0241773 A1* | 10/2007 | Hutchings | ......... | H03K 19/1737 |
| | | | | 326/38 |
| 2007/0241780 A1* | 10/2007 | Teig | ................ | H03K 19/17756 |
| | | | | 326/40 |
| 2007/0260814 A1* | 11/2007 | Branscome | ............ | G11C 15/00 |
| | | | | 711/108 |

OTHER PUBLICATIONS

Jiang, Weirong, "Scalable Ternary Content Addressable Memory Implementation Using FPGAs", Proceeding of the Ninth ACKM/IEEE Symposium on Architectures for Networking and Communications Systems, (ANCS 2013 Conference), pp. 71-82, Oct. 21-22, 2013, San Jose, CA US.

* cited by examiner

MULTIPLEXER-BASED TERNARY CONTENT ADDRESSABLE MEMORY

TECHNICAL FIELD

Examples of the present disclosure generally relate to electronic circuits and, in particular, to a multiplexer-based ternary content addressable memory (TCAM).

BACKGROUND

A content-addressable memory (CAM) is a type of memory used in certain high-speed searching applications. In general, a CAM compares input search data (referred to as "keys", "input keys", or "search keys") against a table of stored data words and returns an indication of matching words. The indication of matching words can be the data of interest or can be used to obtain the data of interest. A binary CAM (BCAM) is the simplest type of CAM that uses input keys to search through stored data words consisting entirely of logic 1's and 0's. A ternary CAM (TCAM) is a CAM that allows for a third matching state of "X" or "don't care" for one or more bits in each of the stored data words being compared with the input keys.

TCAMs can be implemented in programmable integrated circuits (ICs). Example programmable ICs include complex programmable logic devices (CPLDs) and field programmable gate arrays (FPGAs). One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

It is desirable to implement a TCAM in a programmable IC, such as an FPGA, by making efficient use of the available resources.

SUMMARY

Techniques for providing a multiplexer-based ternary content addressable memory (TCAM) are described. In an example, a TCAM includes an input port coupled to receive a W-bit key as input, and an output port coupled to provide a match vector as output. The match vector comprises at least one bit. The TCAM further includes a memory having memory cells operable to store N*W pairs of bits for N W-bit TCAM words. The memory includes a plurality of memory outputs. The TCAM further includes at least one compare circuit. The at least one compare circuit includes at least one multiplexer each coupled to receive as input a true version and a complement version of a bit of the W-bit key. Each of the at least one multiplexer is controlled by a respective pair of memory outputs of the plurality of memory outputs. The at least one compare circuit further includes combinatorial logic coupled to perform at least one logical AND operation based on output of the at least one multiplexer.

In another example, a programmable integrated circuit (IC) includes a configuration memory, and programmable logic including a distributed random access memory (RAM), configurable logic elements, and programmable interconnect elements coupled between the configurable logic elements. The programmable interconnect elements include a plurality of multiplexers each having a plurality of inputs and an output. Each multiplexer of the plurality of multiplexers has a control input coupled to control multiplexing logic. The control multiplexing logic is configured through the configuration memory to select either an output of the configuration memory or an output of the distributed RAM to control the multiplexer.

In another example, a method of implementing a TCAM includes receiving a W-bit key as input; providing an match vector as output, the match vector including at least one bit generated by at least one compare circuit; storing N*W pairs of bits for N W-bit TCAM words in memory cells of a memory, the memory comprising a plurality of memory outputs; coupling a true version and a complement version of a bit of the W-bit key to each of at least one multiplexer in the at least one compare circuit, each of the at least one multiplexer controlled by a respective pair of memory outputs of the plurality of memory outputs; and performing at least one logical AND operation based on output of the at least one multiplexer.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
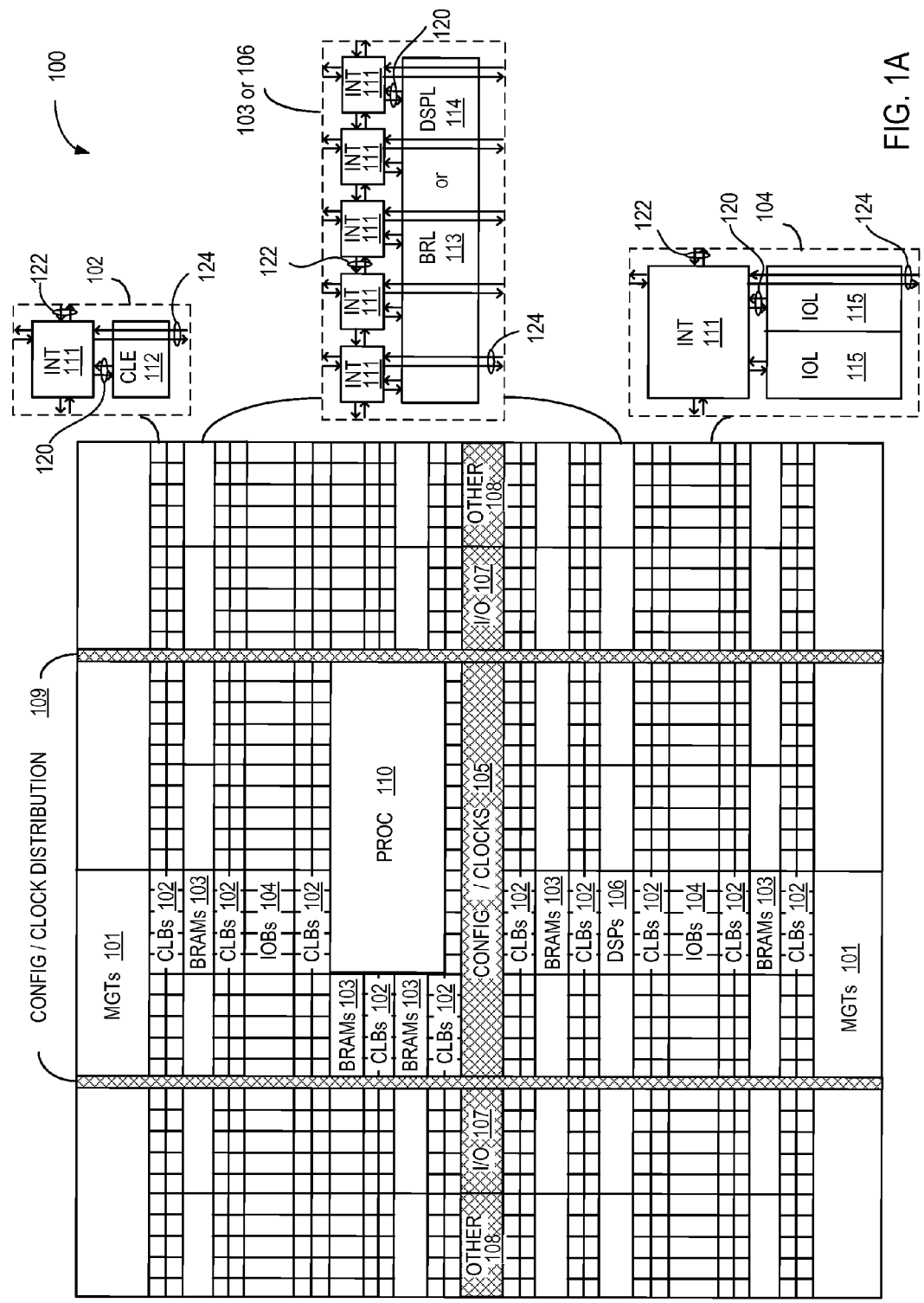
FIG. 1A illustrates an example architecture of an FPGA.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a multiplexer-based ternary content addressable memory (TCAM) are described. Some implementations of a TCAM in a programmable integrated circuit (IC), such as an FPGA, use block random access memory (RAM) or distributed RAM to store data representing TCAM data words. The RAM is addressed using an input key to retrieve a match vector that determines which of stored TCAM words match the input key. In such an implementation, two memory cells per TCAM bit are required in order to implement all possible states (logic "1", logic "0", and don't care "X"). Increasing the input key width doubles the amount of memory cells required to store the TCAM data. As such, the memory efficiency of such a RAM-based TCAM reduces exponentially as the key width increases. Further, such RAMs within a programmable IC may have minimum sizes (e.g. the shallowest RAM may be 32-words deep). As such, the number of memory cells per TCAM bit is typically more than two (e.g., at least six memory cells per TCAM bit given 32-word deep RAMs).

As described herein, a TCAM can be implemented using multiplexer logic in a programmable IC. An input to the multiplexer logic is formed from the input key. Stored TCAM bits are used to control the multiplexer logic. Outputs of the multiplexer logic provide a match vector indicating which TCAM data words match the input key. The multiplexer-based TCAM described herein only requires two memory cells per TCAM bit, which is more efficient that the RAM-based TCAM described above (e.g., at least three times more efficient).

FIG. 1A illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
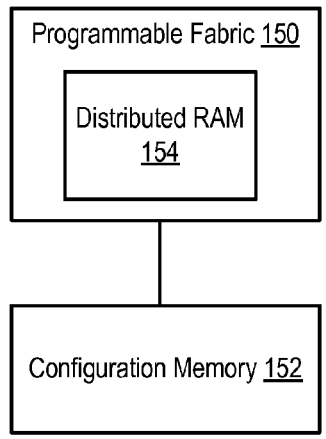
FIG. 1B is a block diagram depicting a higher-level view of the FPGA of FIG. 1A according to an example.

FIG. 1B is a block diagram depicting a higher-level view of the FPGA 100 according to an example. The FPGA 100 includes a programmable fabric 150, which can include the various programmable tiles described above. The programmable fabric 150 is coupled to a configuration memory 152. The configuration memory 152 comprises a random access memory (RAM), such as a static RAM (SRAM) or the like. The configuration memory 152 can be loaded with a configuration bitstream for programming ("configuring") the programmable fabric 150. For example, a configuration bitstream can be loaded into the configuration memory 152 to configure a TCAM in the programmable fabric 150, as described herein. In some examples, at least some CLEs 112 in the FPGA 100 can be configured as a RAM. Such a RAM can be distributed across the programmable fabric 150 and is generally referred to as a distributed RAM 154. The distributed RAM 154 can be implemented using one or more CLEs 112.

In examples described herein, a multiplexer-based TCAM can be implemented within a programmable IC, such as the FPGA 100. The stored data words for the TCAM can be stored in the configuration memory 152 or in the distributed RAM 154 of the FPGA 100. The compare logic can be implemented using multiplexers in programmable interconnect elements 111 and lookup-tables (LUTs) in CLEs 112. Examples of a multiplexer-based TCAM are first described below, followed by example implementations of such a multiplexer-based TCAM in a programmable IC, such as the FPGA 100.

Figure 2:
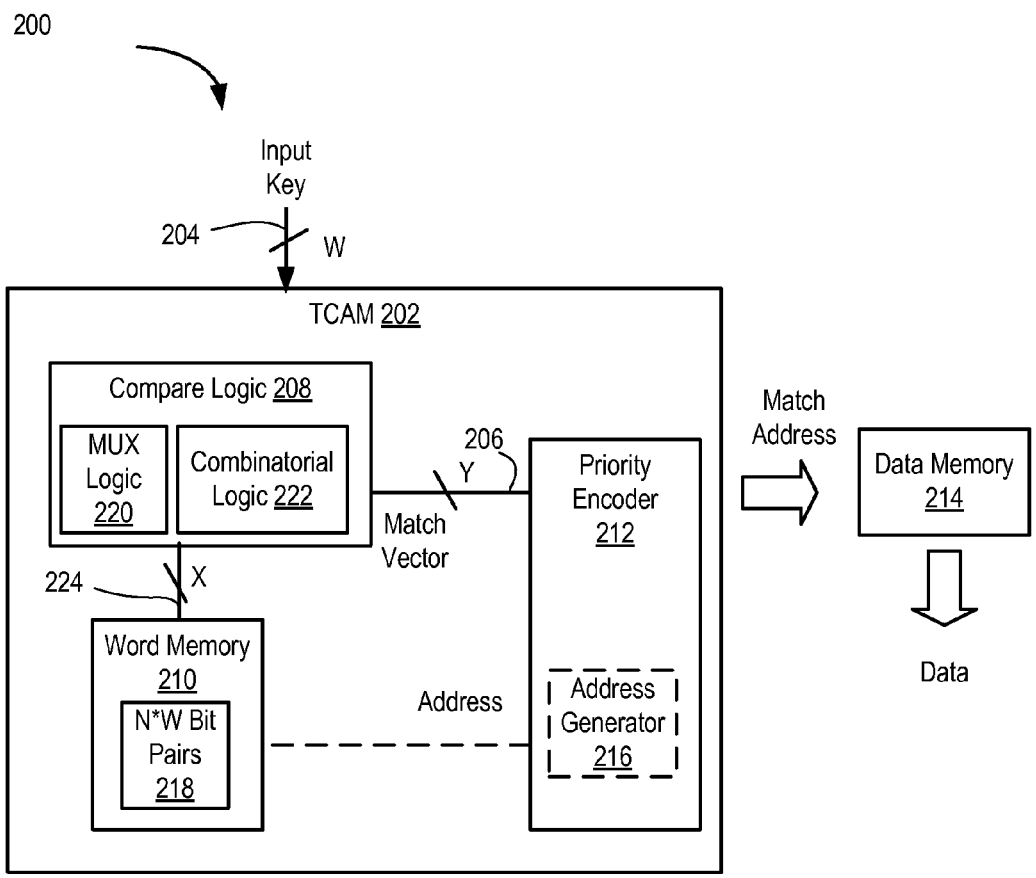
FIG. 2 is a block diagram depicting an example TCAM system.

FIG. 2 is a block diagram depicting an example TCAM system 200. The TCAM system 200 includes a TCAM 202. An input port 204 of the TCAM 202 is W-bits wide and is coupled to receive a W-bit input key (where W is an integer greater than zero). The TCAM 202 includes compare logic 208 coupled to a word memory 210. The compare logic 208 includes at least one compare circuit (described below) having one or more multiplexers ("multiplexer logic 220") that are controlled by outputs of the word memory 210. The compare logic 208 also includes combinatorial logic 222 coupled to output of the multiplexer logic 220. The word memory 210 includes an X-bit output 224 to provide X outputs to the compare logic 208. The word memory 210 stores bits for N W-bit TCAM words, where N is an integer greater than zero. The word memory 210 can be a RAM, such as a static RAM (SRAM), dynamic RAM (DRAM), or the like.

In particular, the word memory 210 stores a pair of bits for each bit of the N TCAM words (e.g., N*W bit pairs or 2*N*W bits). As described above, the bits of a TCAM word can have values of logic "1", logic "0", or don't care "X". Accordingly, each bit of a TCAM word is represented by a pair of bits in the word memory 210 comprising a data bit and a mask bit. The data bit determines whether a bit in a TCAM word is logic "1" or logic "0". The mask bit determines whether a bit in a TCAM word is don't care "X". If the mask bit is a logic "0", the value of the TCAM bit is the value of the data bit. If the mask bit is a logic "1", the value of the TCAM bit is logic "1".

Based on the input key and bit pairs stored in the word memory 210, the compare logic 208 outputs a Y-bit match vector on an output port 206, where Y is an integer greater than zero. The match vector indicates which of the N TCAM words represented in the word memory 210 match the input key.

In an example, X equals 2*W*N such that the word memory 210 includes 2*W*N outputs. For example, each bit in the bit pairs 218 can be stored in a memory cell that is coupled to the compare logic 208. In such an example, the input key can be compared against the N TCAM words represented in the word memory 210 in parallel to generate an N-bit match vector (e.g., Y equals N). A logic "1" in the N-bit match vector indicates a positive match, and a logic "0" in the N-bit match vector indicates a negative match.

In other examples, the word memory 210 comprises an addressable RAM storing X-bit words. In one example, each X-bit word represents one W-bit TCAM word and thus X equals 2*W. The depth of the word memory 210 is equal to N to represent each of the N TCAM words. An address generator 216 can be used to address the word memory 210 to provide a sequence of 2*W bit words to compare logic 208. The compare logic 208 compares each 2*W bit word from word memory 210 (e.g., representing one TCAM word) with the input key and generates the match vector. In such an example, the match vector includes one bit (e.g., Y equals 1) that indicates whether the current TCAM word matches the input key. Thus, the input key can be compared against N TCAM words represented in the word memory 210 in sequence.

In another example, each X-bit word of the word memory 210 represents one bit of N TCAM words and thus X equals 2*N. The depth of the word memory 210 is equal to W to represent each bit of the W-bit TCAM word. The address generator 216 can be used to address the word memory 210 to provide a sequence of 2*N bit words to compare logic 208. The compare logic 208 can serialize the W-bit input key (or the W-bit input key can be provided to the compare logic 208 as a serial bit stream) and compares each bit of the input key to respective bits of the N TCAM words and generates the match vector. In such an example, the match vector includes N bits (e.g., Y equals N), one bit for each of the N TCAM words. Thus, the input key can be compared against W bits of N TCAM words represented in the word memory 210 in sequence.

The Y-bit match vector can be used as the output of the TCAM 202. Alternatively, the Y-bit match vector can be used to obtain additional data from an external data memory 214. The additional data can include data words corresponding to the TCAM words.

In an example, the TCAM 202 includes a priority encoder 212 coupled to the output port 206. The priority encoder 212 receives one or more Y-bit match vectors and generates an address (match address). If the word memory 210 is an addressable RAM, the priority encoder 212 can include the address generator 216. Otherwise the address generator 216 can be omitted. The match address can be coupled to an address port of the external data memory 214 to retrieve data. In this manner, data associated with an input key can be obtained. The Y-bit match vector(s) can indicate multiple positive matches (e.g., multiple ones of the N TCAM words can match a given input key). The priority encoder 212 can give priority to one of the matching TCAM words over other matching TCAM word(s) and generate a match address for the external data memory 214 accordingly. In this manner, the data output from the external data memory 214 for a given input key is associated with a given TCAM word having the highest priority. In another example, if the word memory 210 is an addressable RAM having 2*W bit words each representing a TCAM word, the priority encoder 212 can control the address generator 216 to address the word memory 210 until the first match is detected.

Figure 3A:
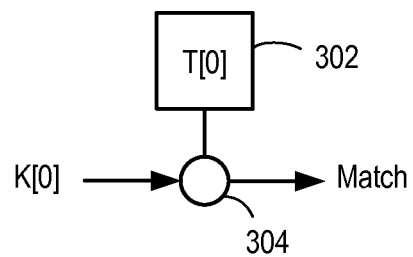
FIG. 3A is a block diagram depicting an example 1×1 TCAM.
Figure 3B:
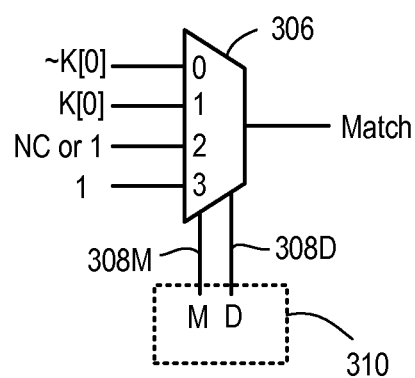
FIG. 3B is a block diagram depicting an example implementation of the 1×1 TCAM of FIG. 3A.

FIG. 3A is a block diagram depicting an example 1×1 TCAM. FIG. 3B is a block diagram depicting an example implementation of the 1×1 TCAM of FIG. 3A. As shown in FIG. 3A, a 1-bit input key K[0] is input to a compare function 304. A storage location 302 stores a bit T[0] of a 1-bit TCAM word. The bit T[0] can be logic "1", logic "0", and don't care "X". The input key K[0] can be logic "1" or logic "0". The compare function 304 outputs a logic "1" if the input key K[0] matches the TCAM word T[0] or if the TCAM word T[0] is a don't care "X". The compare function 304 outputs a logic "0" if the input key K[0] does not match the TCAM word T[0].

As shown in FIG. 3B, the 1×1 TCAM of FIG. 3A can be implemented using a multiplexer 306 and a pair of memory outputs 308M and 308D (collectively memory outputs 308). Each of the memory outputs 308 provides a bit. The memory output 308M provides a mask bit for the bit T[0] of a TCAM word. The memory output 308D provides a data bit for the bit T[0] of a TCAM word. The mask and data bits are stored in a memory 310 having the memory outputs 308.

In the example shown, the multiplexer 306 includes four inputs, including a first input coupled to receive a complement of the input key K[0] (a complemented version of the input key), a second input coupled to receive the input key K[0] (a true version of the input key), a third input is not connected (NC) (or otherwise ignored), and a fourth input is coupled to receive a constant logic "1". In another example, the third not connected input of the multiplexer 306 can be omitted and the multiplexer 306 can include three inputs. Alternatively, both the third and fourth inputs of the multiplexer 306 can be coupled to receive a constant logic "1", effectively converting the four-input multiplexer into a three-input multiplexer. The multiplexer 306 includes two control inputs, one coupled to receive a mask bit provided the memory output 308M and another coupled to receive a data bit provided by the memory output 308D. The multiplexer 306 provides a match output.

The multiplexer 306 operates according to the following table:

TABLE 1

| Mask | Data | Output |
| --- | --- | --- |
| 0 | 0 | ~K[0] |
| 0 | 1 | K[0] |
| 1 | 0 | 1 |
| 1 | 1 | 1 |

The MD bit pairs "00", "01", and "11" represent "0", "1", and "don't care" for one TCAM bit. In some examples, the MD bit pair "10" is not used. In other examples, the MD bit pair "10" can also represent "don't care" for the TCAM bit. Accordingly, for MD of "01", the output is K[0]. For MD of "00", the output is ~K[0]. For MD of "11" (or "10", the output is a constant logic "1".

The 1×1 TCAM implementation shown in FIG. 3B can be extended to a general N×W TCAM, where N is the depth of the TCAM and W is the width of the TCAM. Furthermore, such an N×W TCAM can be implemented using a word memory having individually accessible memory cells, or using an addressable word memory.

Figure 4:
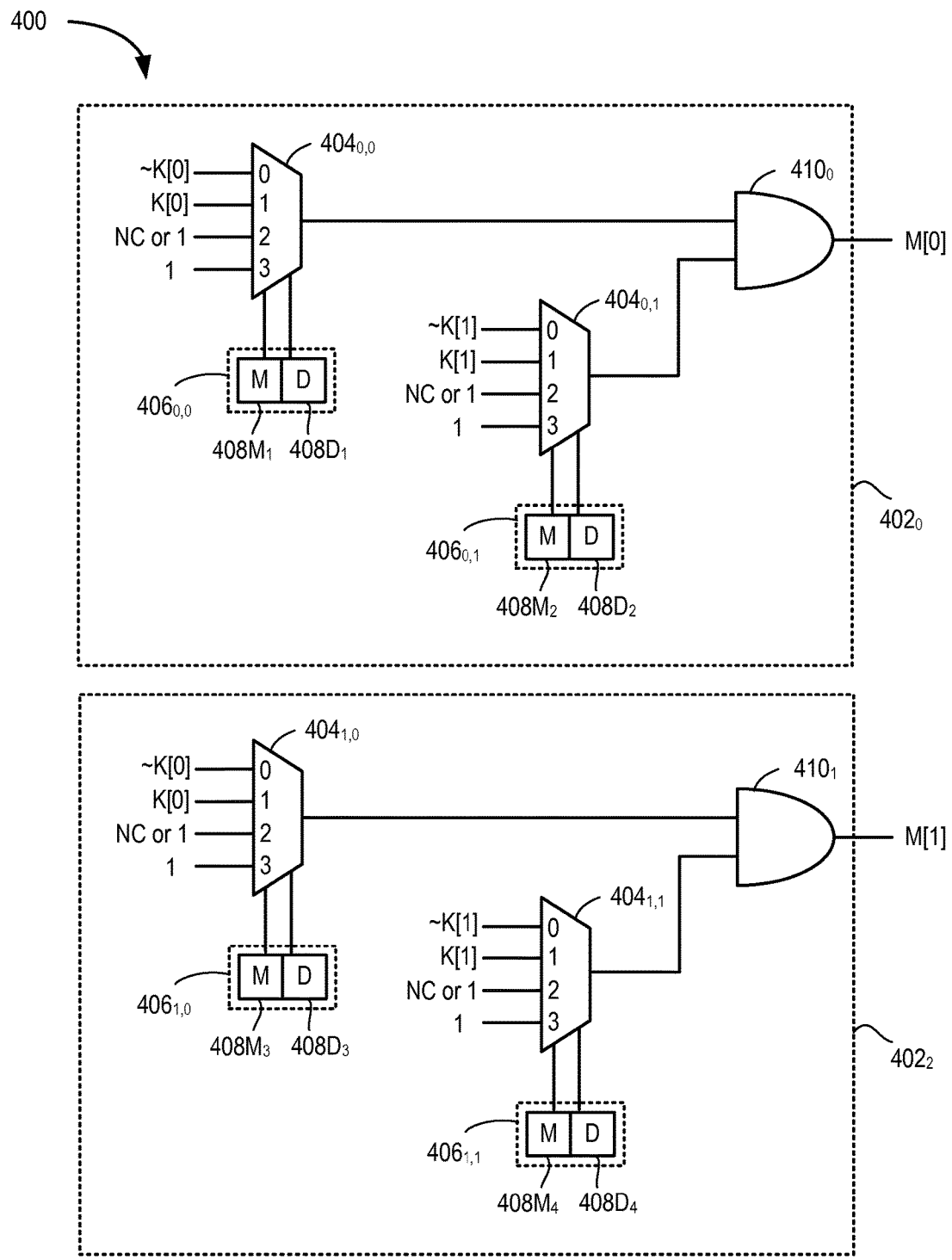
FIG. 4 is a block diagram depicting an example 2×2 TCAM that can, by extension, be generalized as an N×W TCAM.

FIG. 4 is a block diagram depicting an example TCAM 400 having a depth of 2 and a width of 2. The TCAM 400 includes an implementation of the compare logic 208 and the word memory 210, where the word memory 210 has individually accessible memory cells. As described in examples below, such a word memory can be included in a programmable IC, such as an FPGA. Those skilled in the art will appreciate that the TCAM 400 can be extended to the general case of a depth of N and a width of W based on the description of the 2×2 TCAM below.

The TCAM 400 comprises compare circuits $402_0$ and $402_1$ (collectively compare circuits 402). The compare circuits 402 implement the compare logic 208. The number of compare circuits 402 corresponds to the depth of the TCAM 400 (e.g., the number of words stored in the TCAM 400). Thus, in the present example, there are two compare circuits 402 for a depth of N=2 TCAM words. The compare circuit $402_0$ comprises a multiplexer $404_{0,0}$, a multiplexer $404_{0,1}$, and an AND gate $410_0$. Similarly, the compare circuit $402_1$ comprises a multiplexer $404_{1,0}$, a multiplexer $404_{1,1}$, and an AND gate $410_1$. The multiplexers $404_{0,0}$ through $404_{1,1}$ are collectively referred to as "multiplexers 404." In general, each of the compare circuits 402 includes W multiplexers, where W is the width of the TCAM 400. Thus, in the present example, there are two multiplexers 404 for a width of W=2 for the TCAM words. The AND gate $410_0$ and the AND gate $410_1$ are collectively referred to as "combinatorial logic 410."

In the compare circuit $402_0$ for a first TCAM word $406_0$, the multiplexer $404_{0,0}$ is controlled by a least significant bit (LSB) of the first TCAM word $406_0$ (TCAM bit $406_{0,0}$). As described above, each bit of a TCAM word is represented in memory using a mask/data bit pair. The mask and data bits for the TCAM bit $406_{0,0}$ are stored in memory cells $408M_1$ and $408D_1$, respectively. The multiplexer $404_{0,1}$ is controlled by a most significant bit (MSB) of the first TCAM word $406_0$ (TCAM bit $406_{0,1}$). The mask and data bits for the TCAM bit $406_{0,1}$ are stored in memory cells $408M_2$ and $408D_2$, respectively.

In the compare circuit $402_1$ for a second TCAM word $406_1$, the multiplexer $404_{1,0}$ is controlled by an LSB of the second TCAM word $406_1$ (TCAM bit $406_{1,0}$). The mask and data bits for the TCAM bit $406_{1,0}$ are stored in memory cells $408M_3$ and $408D_4$, respectively. The multiplexer $404_{1,1}$ is controlled by an MSB of the second TCAM word $406_1$ (TCAM bit $406_{1,1}$). The mask and data bits for the TCAM bit $406_{1,1}$ are stored in memory cells $408M_4$ and $408D_4$, respectively. The memory cells $408D_1$ through $408D_4$, and the memory cells $408M_1$ through $408M_4$ are collectively referred to as "memory cells 408." The memory cells 408 are memory cells in the word memory 210.

In the compare circuit $402_0$, the AND gate $410_0$ combines the outputs of two 1×1 multiplexer-based TCAM implementations (e.g., two instances of the TCAM implementation in FIG. 3B). The multiplexer $404_{0,0}$ receives true and complement versions of the first bit of the search key K[0], and the multiplexer $404_{0,1}$ receives true and complement versions of the second bit of the search key K[1]. In general, the search key comprises W-bits for a W-bit wide TCAM. Thus, in the present example, the search key comprises two bits K[0] and K[1]. The multiplexers $404_{1,0}$ and $404_{1,1}$ receive true and complement versions of the search key K[0], and true and complement versions of the search key K[1], respectively. The outputs of the multiplexers $404_{0,0}$ and $404_{0,1}$ are coupled to inputs of the AND gate $410_0$. The outputs of the multiplexers $404_{1,0}$ and $404_{1,1}$ are coupled to inputs of the AND gate $410_1$.

The AND gate $410_0$ outputs a first match bit M[0], and the AND gate $410_1$ outputs a second match bit M[1]. In general, a match bit vector includes N bits, one bit for each of the N TCAM words. The AND gate $410_0$ outputs a logic "1" if the search key K[1:0] respectively matches the TCAM bits $406_{0,0}$ and $406_{0,1}$ of the first TCAM word $406_0$, and logic "0" otherwise. The AND gate $410_1$ outputs a logic "1" if the search key K[1:0] respectively matches the TCAM bits $406_{1,0}$ and $406_{1,1}$ of the second TCAM word $406_1$, and logic "0" otherwise. Each of the multiplexers 404 operates as described above with respect to FIG. 3A.

The TCAM 400 can be generalized to produce an N×W TCAM. An N×W TCAM includes N of the compare circuits 402. In an N×W TCAM, each of the compare circuits 402 includes W of the multiplexers 404. Each of the multiplexers is controlled by a particular bit pair stored in the memory cells 408. An N×W TCAM would require 2*N*W of the memory cells 408. The combinatorial logic 410 of an N×W TCAM performs N logical AND operations. The match bit vector M includes N bits, one bit for each of the N TCAM words.

The TCAM 400 or a generalized N×W version of the TCAM 400 can be used in the TCAM 202 shown in FIG. 2. The compare logic 208 includes the multiplexers 404 and the combinatorial logic 410. The word memory 210 includes the memory cells 408. The output of the combinatorial logic 410 provides the N-bit match vector on the output port 206. Thus, the TCAM 400 or a generalized N×W version of the TCAM 400 can also be coupled to a priority encoder 212, which addresses the external data memory 214, as shown in FIG. 2.

Figure 5:
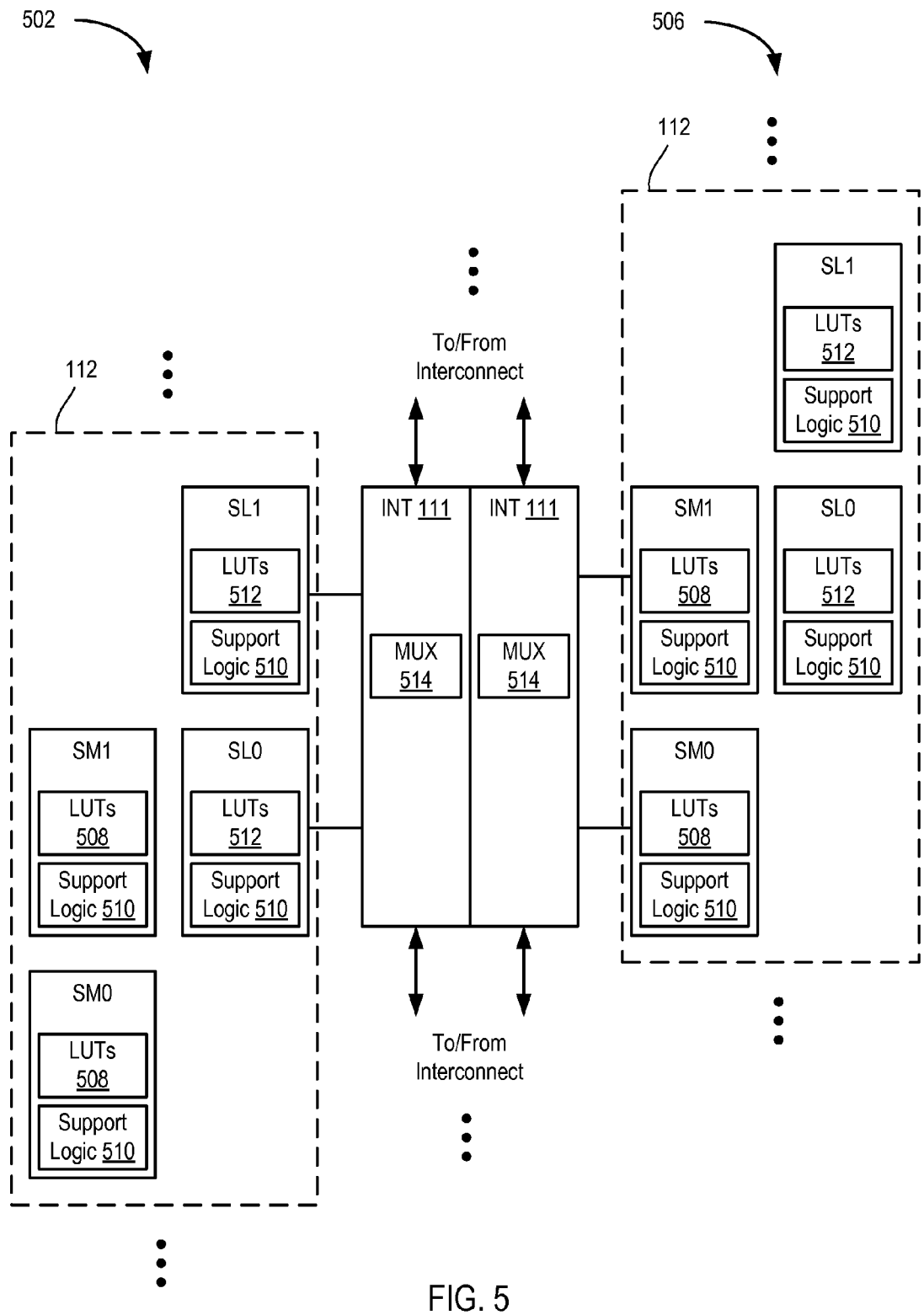
FIG. 5 is a block diagram depicting a portion of the programmable fabric of the FPGA shown in FIGS. 1A-1B.

FIG. 5 is a block diagram depicting a floorplan of the programmable fabric 150 of the FPGA 100 that can be used to implement a multiplexer-based TCAM as described herein. FIG. 5 shows two columns 502 and 506 of programmable tiles in the programmable fabric 150. The programmable tiles in the columns 502 and 506 comprise CLEs 112. In each of the columns 502 and 506, only one CLE 112 is shown, but the columns 502 and 506 generally include a plurality of CLEs. Each of the CLEs 112 is coupled to an interconnect element 111.

Each of the CLEs 112 comprises four slices SM1-SM0 and SL0-SL1. The slices SM0-SL1 are of one type (type "M"), the slices SL0-SL1 are of another type (type "L"). The type "M" slices SM0 and SM1 include lookup tables (LUTs) 508 and support logic 510. The LUTs 508 can be configured as function generators to perform any combinatorial function having a plurality of inputs and a plurality of outputs. The LUTs 508 can also be configured as a LUT-RAM configured to store a plurality of bits. The support logic 510 can include flip-flops, multiplexers, carry-chain logic, and the like that support the LUTs 508. The type "L" slices SL0 and SL1 include LUTs 512 and support logic 510. The LUTs 512 can be configured as function generators, but not as LUT-RAM. The architecture shown in FIG. 5 is just one example. In other examples, all LUTs in a CLE 112 can comprise LUT-RAMs (every slice is of type "M"), or all LUTs in a CLE 112 can comprise LUTs that cannot be configured as a RAM (every slice is of type "L").

In the example, the type "L" slices SL0 and SL1 in the column 502 are adjacent the type "M" slices SM0 and SM1 in the column 506 having two interconnect elements 111 therebetween. The slices SL0-SL1 in the column 502 are coupled to one of the interconnect elements 111, and the slices SM0-SM1 in the column 506 are coupled to another of the interconnect elements 111. The interconnect elements 111 can be coupled to each other. Each of the interconnect elements 111 includes multiplexers 514. Different ones of the multiplexers 514 can have different inputs, such as inputs from the CLE 112 in the column 502, inputs from the CLE 112 in the column 506, inputs from multiplexers 514 in another interconnect element 111, or inputs from the interconnect. Likewise, different ones of the multiplexers 514 can have different outputs, such as outputs to the CLE 112 in the column 502, outputs to the CLE 112 in the column 506, outputs to another interconnect element 111, or outputs to the interconnect.

The TCAM 400 (or generalized N×W version thereof) can be implemented in the programmable fabric 150. The multiplexers 404 can be implemented using the multiplexers 514 in the interconnect elements 111. The combinatorial logic 410 can be implemented using LUTs 512 in type "L" slices in the column 502. In an embodiment, the memory cells 408 comprise memory cells of the configuration memory 152 that are coupled to the multiplexers 514. In another embodiment, the memory cells 408 comprise memory cells of the distributed RAM 154, implemented using LUTs 508 in the type "M" slices in the column 506.

In another example, the multiplexers 404 can be implemented using multiplexers in a tile added to the programmable fabric 150. That is, rather than using multiplexers 514 in the interconnect elements 111, the programmable fabric 150 can include dedicated multiplexers in one or more multiplexer tiles. Thus, within the context of FIG. 5, the interconnect elements 111 can, in some examples, be replaced with a multiplexer tile having the multiplexers 514 for use in implementing the TCAM 400.

Figure 6A:
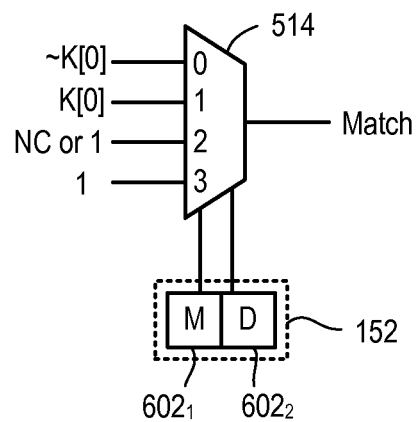
FIG. 6A is a block diagram showing a multiplexer in an FPGA configured to implement part of a TCAM.

FIG. 6A is a block diagram showing a multiplexer 514 in the FPGA 100 configured to implement part of a TCAM. The multiplexer 514 is configured as shown by the implementation in FIG. 3B. The mask and data bits for the given TCAM bit are stored in memory cells $602_1$ and $602_2$, respectively, which are part of the configuration memory 152. In such an implementation, the TCAM data words are stored in the configuration memory 152.

Figure 6B:
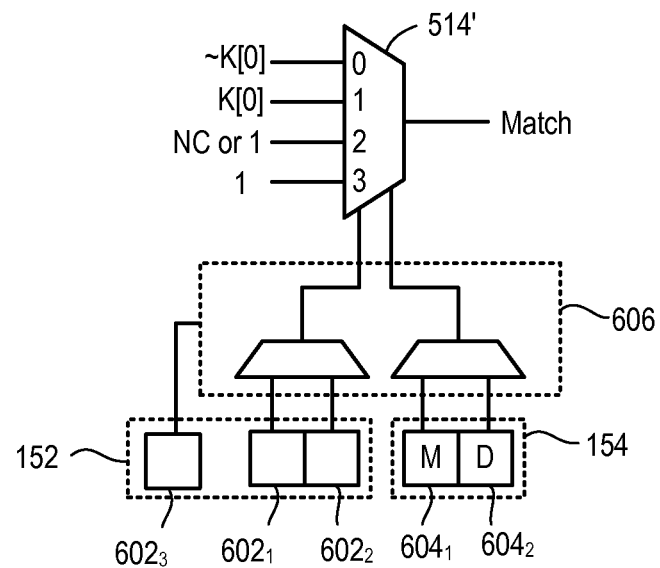
FIG. 6B is a block diagram showing another multiplexer in an FPGA configured to implement part of a TCAM.

FIG. 6B is a block diagram showing a multiplexer 514' in the FPGA 100 configured to implement part of a TCAM. The multiplexer 514' is configured as shown by the implementation in FIG. 3B. The multiplexer 514' includes additional control multiplexer logic 606 to implement a "fast-update" mode. In the implementation shown in FIG. 6A, the TCAM data words are updated by loading new data into the configuration memory 152 in the appropriate memory cells. In the implementation shown in FIG. 6B, the TCAM data words are updated by loading new data into the distributed RAM 154. In particular, the control multiplexer logic 606 controls whether memory cells $602_1$ and $602_2$ in the configuration memory 152, or memory cells $604_1$ and $604_2$ in the distributed RAM 154 are coupled to control the multiplexer 514'. A memory cell $602_3$ in the configuration memory 152 can store a bit that determines whether the configuration memory 152 or the distributed RAM 154 feeds the control port of the multiplexer 514'. The distributed RAM 154 can be updated faster than the configuration memory 152, allowing for a faster update of the TCAM data words in the implementation of FIG. 6B.

Figure 7A:
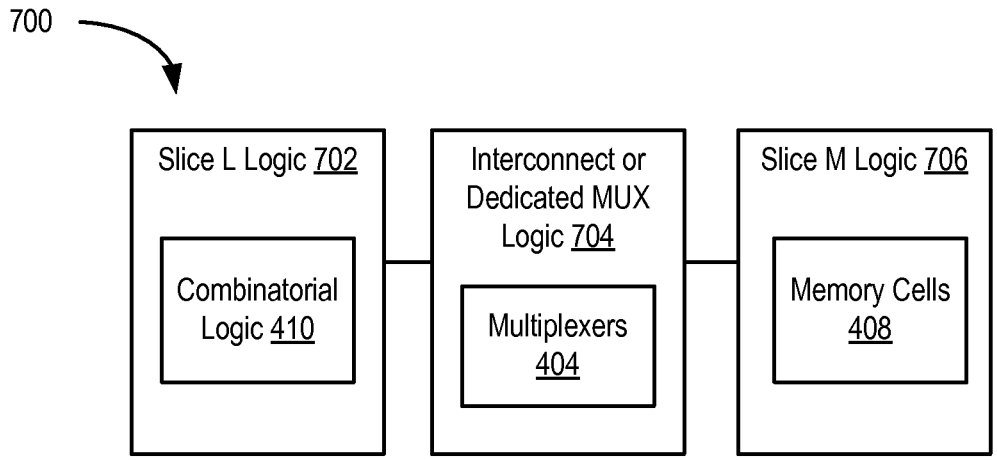
FIG. 7A is a block diagram showing an example implementation of the TCAM of FIG. 4 in a programmable IC.

FIG. 7A is a block diagram showing an example implementation 700 of the TCAM 400 (or an N×W generalized version of the TCAM 400) in a programmable IC, such as the FPGA 100. The TCAM implementation 700 includes the combinatorial logic 410 implemented using type "L" slice logic 702. The LUTs in the type "L" slice logic 702 are used to implement the AND gate logic. In another example, the combinatorial logic 410 can be implemented using type "M" slice logic, since the LUTs in type "M" slice logic can also implement the AND gate logic. The multiplexers 404 are implemented in interconnect logic or dedicated multiplexer logic 704, as described above. The interconnect logic or dedicated multiplexer logic 704 includes the additional control logic (e.g., the control multiplexer logic 606) that allows the multiplexers therein to be controlled by distributed RAM cells. The memory cells 408 that store the bit pairs representing the TCAM bits are implemented using type "M" slice logic 706. The LUTs in the type "M" slice logic 706 are used as LUT-RAMs to implement a distributed RAM.

Figure 7B:
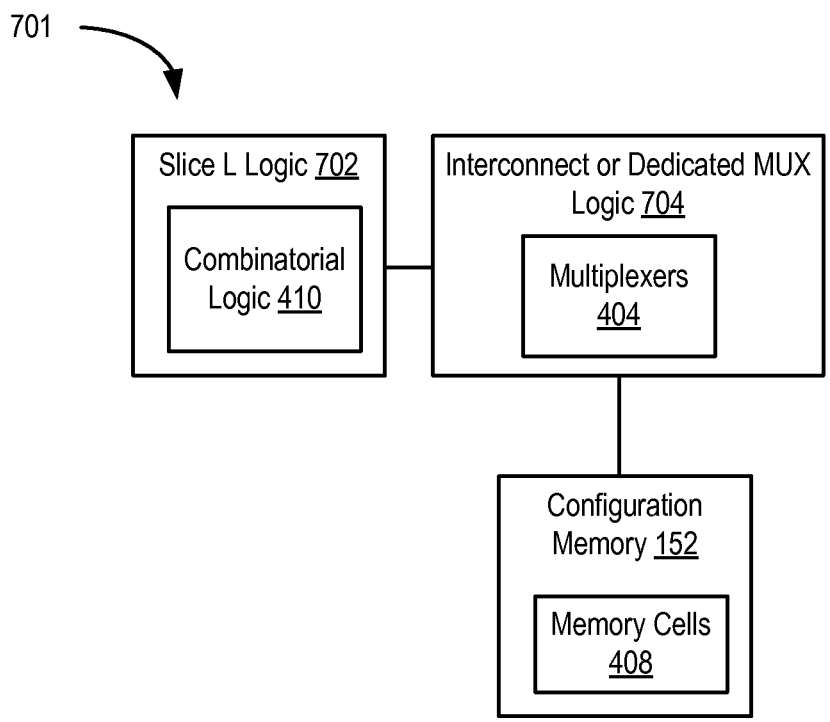
FIG. 7B is a block diagram showing another example implementation of the TCAM of FIG. 4 in a programmable IC.

FIG. 7B is a block diagram showing an example implementation 701 of the TCAM 400 (or an N×W generalized version of the TCAM 400) in a programmable IC, such as the FPGA 100. The TCAM implementation 701 is similar to the TCAM implementation 700, but having the memory cells 408 implemented within the configuration memory 152, rather than in the distributed RAM 154.

Figure 8:
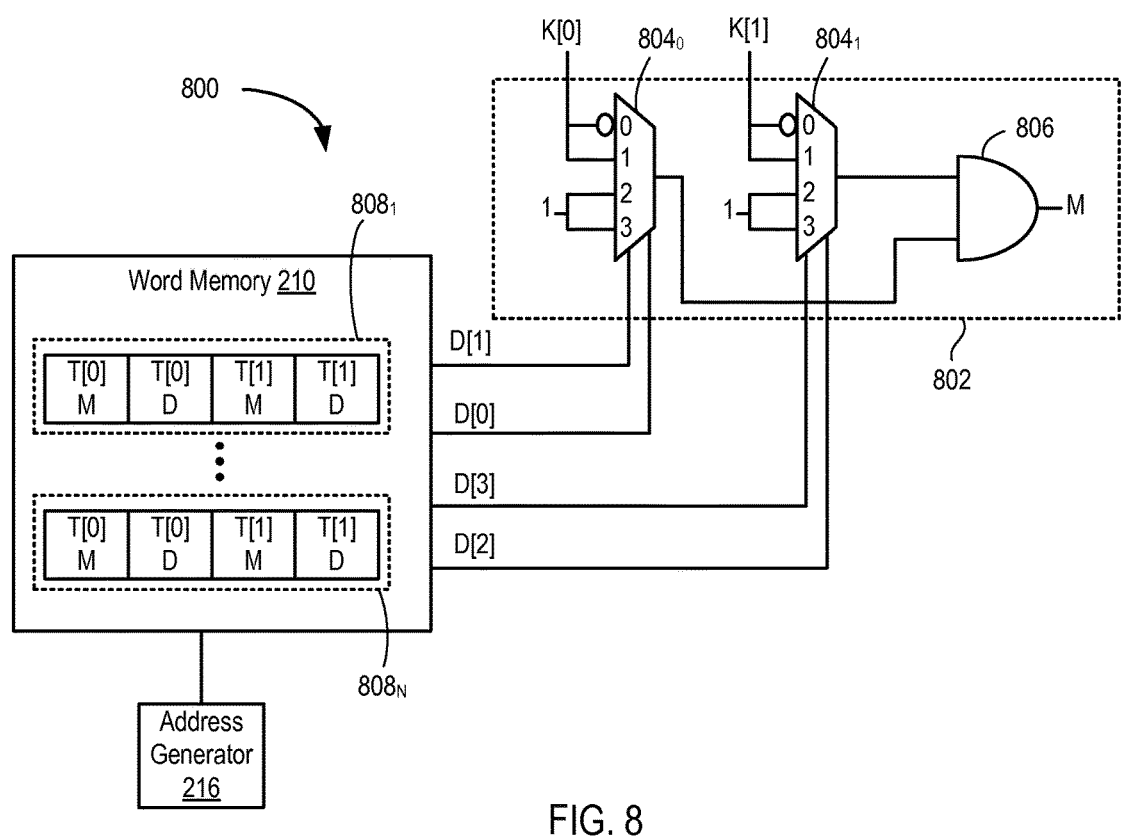
FIG. 8 is a block diagram depicting another example of a TCAM having a depth of N and a width of two.

FIG. 8 is a block diagram depicting another example of a TCAM 800 having a depth of N and a width of two. The TCAM 800 includes an implementation of the compare logic 208 and the word memory 210, where the word memory 210 is an addressable RAM. Those skilled in the art will appreciate that the TCAM 800 can be extended to the general case of a depth of N and a width of W based on the description of the N×2 TCAM below.

The TCAM 800 includes a compare circuit 802 coupled to the word memory 210. The word memory 210 stores 4-bit RAM words $808_1$ through $808_N$ (collectively RAM words 808). Each of the RAM words 808 represents a TCAM word. As such, each of the RAM words 808 includes a pair of bits (M,D) for each bit of a TCAM word such that each 4-bit RAM word 808 represents a 2-bit TCAM word T[1:0]. The word memory 210 includes a 4-bit output D[3:0].

The compare circuit 802 includes multiplexers $804_0$ and $804_1$ (collectively multiplexers 804) and an AND gate 806 (or some combinatorial logic implementing a logical AND operation). The multiplexers 804 are implementations of the multiplexer 306 shown in FIG. 3B. First and second terminals of the multiplexer $804_0$ receives complement and true versions of bit K[0] of an input key, and first and second terminals of the multiplexer $804_1$ receives complement and true versions of bit K[1] of the input key. Third and fourth terminals of each of the multiplexers 804 receive a constant logic "1" (or the third terminal can be not connected). Outputs of the multiplexers 804 are coupled to inputs of the AND gate 806. An output of the AND gate 806 provides a match output M. Bits D[0] and D[1] control the multiplexer $804_0$, and bits D[2] and D[3] control the multiplexer $804_1$.

In operation, the address generator 216 addresses the word memory 210 to output a RAM word 808 representing a TCAM word. The bit pair (M,D) for TCAM bit T[0] provided by D[1:0] controls the multiplexer $804_0$, and the bit pair (M,D) for TCAM bit T[1] provided by D[3:2] controls the multiplexer $804_1$. The address generator 216 can generate a plurality of addresses for the word memory 210 to compare the input key with a plurality of TCAM words in sequence. The address generator 216 can stop generating addresses when at least one match has been found. For each comparison, the match bit M indicates a positive or negative match. A complete comparison of the input key to the TCAM words requires N generated addresses. The TCAM 800 can be extended to support W-bit TCAM words by duplicating adding additional multiplexers 804 and extending the output of the word memory 210 to be D[W-1:0].

Figure 9:
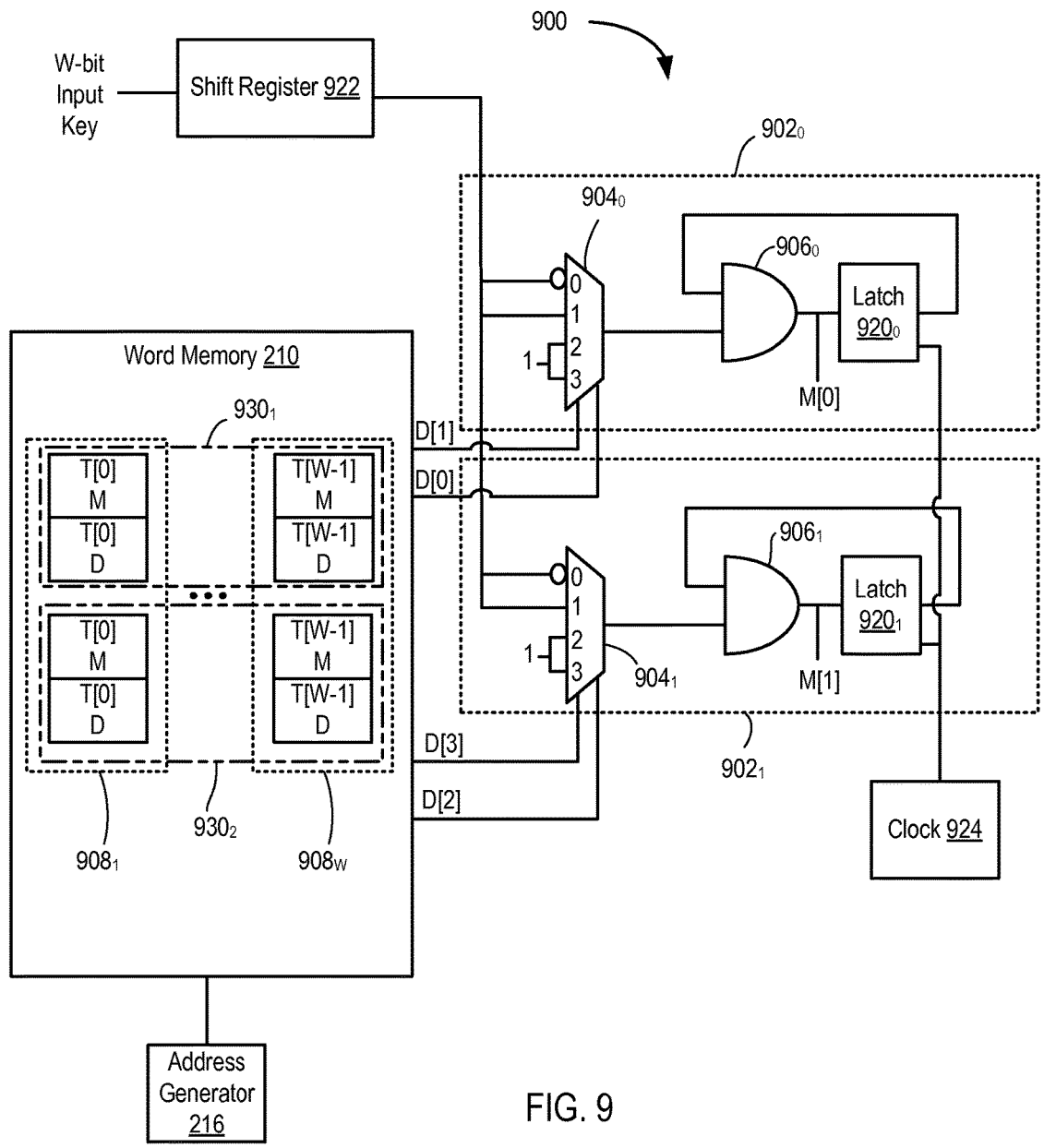
FIG. 9 is a block diagram depicting another example of a TCAM having a depth of two and a width of W.

FIG. 9 is a block diagram depicting another example of a TCAM 900 having a depth of 2 and a width of W. The TCAM 900 includes an implementation of the compare logic 208 and the word memory 210, where the word memory 210 is an addressable RAM. Those skilled in the art will appreciate that the TCAM 900 can be extended to the general case of a depth of N and a width of W based on the description of the 2×W TCAM below.

The TCAM 900 includes compare circuits $902_0$ and $902_1$ (collectively compare circuits 902) coupled to the word memory 210. The word memory 210 stores 4-bit RAM words $908_1$ through $908_W$ (collectively RAM words 908). Each of the RAM words 908 represents a given bit of two TCAM words $930_1$ and $930_2$. As such, each of the RAM words 908 includes a pair of bits (M,D) for each bit of a TCAM word such that each 4-bit RAM word 908 represents a given bit T of two TCAM words $930_1$ and $930_2$. For example, RAM word $908_1$ includes represents bit T[0] of each TCAM word $930_1$ and $930_2$. RAM word $908_W$ represents bit T[W-1] of each TCAM word $930_1$ and $930_2$. The word memory 210 includes a 4-bit output D[3:0].

The compare circuit $902_0$ includes a multiplexer $904_0$, an AND gate $906_0$ (or some combinatorial logic implementing a logical AND operation), and a latch $920_0$. First and second inputs of the multiplexer $904_0$ are coupled to an output of a shift register 922. The shift register 922 outputs a serial bit stream of the input key. The third and fourth terminals of the multiplexer $904_0$ are coupled to receive a constant logic "1" (or the third terminal can be not connected). An output of the multiplexer $904_0$ is coupled to an input of the AND gate $906_0$. An output of the AND gate $906_0$ is coupled to the latch $920_0$ and provides a bit M[0] of a match vector. An output of the latch $920_0$ is coupled to another input of the AND gate $906_0$. A clock port of the latch $920_0$ is coupled to receive a clock signal from a clock 924.

The compare circuit $902_1$ includes a multiplexer $904_1$, an AND gate $906_1$ (or some combinatorial logic implementing a logical AND operation), and a latch $920_1$. First and second inputs of the multiplexer $904_1$ are coupled to an output of the shift register 922. The third and fourth terminals of the multiplexer $904_1$ are coupled to receive a constant logic "1" (or the third terminal can be not connected). An output of the multiplexer $904_1$ is coupled to an input of the AND gate $906_1$. An output of the AND gate $906_1$ is coupled to the latch $920_1$ and provides a bit M[1] of a match vector. An output of the latch $920_1$ is coupled to another input of the AND gate $906_1$. A clock port of the latch $920_1$ is coupled to receive the clock signal from the clock 924.

The multiplexers $904_0$ and $904_1$ (collectively multiplexers 904) are implementations of the multiplexer 306 shown in FIG. 3B. Bits D[0] and D[1] control the multiplexer $904_0$, and bits D[2] and D[3] control the multiplexer $904_1$.

In operation, the address generator 216 addresses the word memory 210 to output a RAM word 908 representing a bit of each of the two TCAM words $930_1$ and $930_2$. A bit pair (M,D) for the first TCAM word $930_1$ provided by D[1:0] controls the multiplexer $904_0$, and the bit pair (M,D) for the second TCAM word $930_2$ provided by D[3:2] controls the multiplexer $904_1$. The address generator 216 can generate a plurality of addresses for the word memory 210 to compare bits of the input key with corresponding bits of a plurality of TCAM words in sequence. A complete comparison of the input key to the TCAM words requires W generated addresses. The TCAM 900 can be extended to support N TCAM words by duplicating the compare circuit 902 and extending the output of the word memory 210 to be D[N-1:0].

Figure 10:
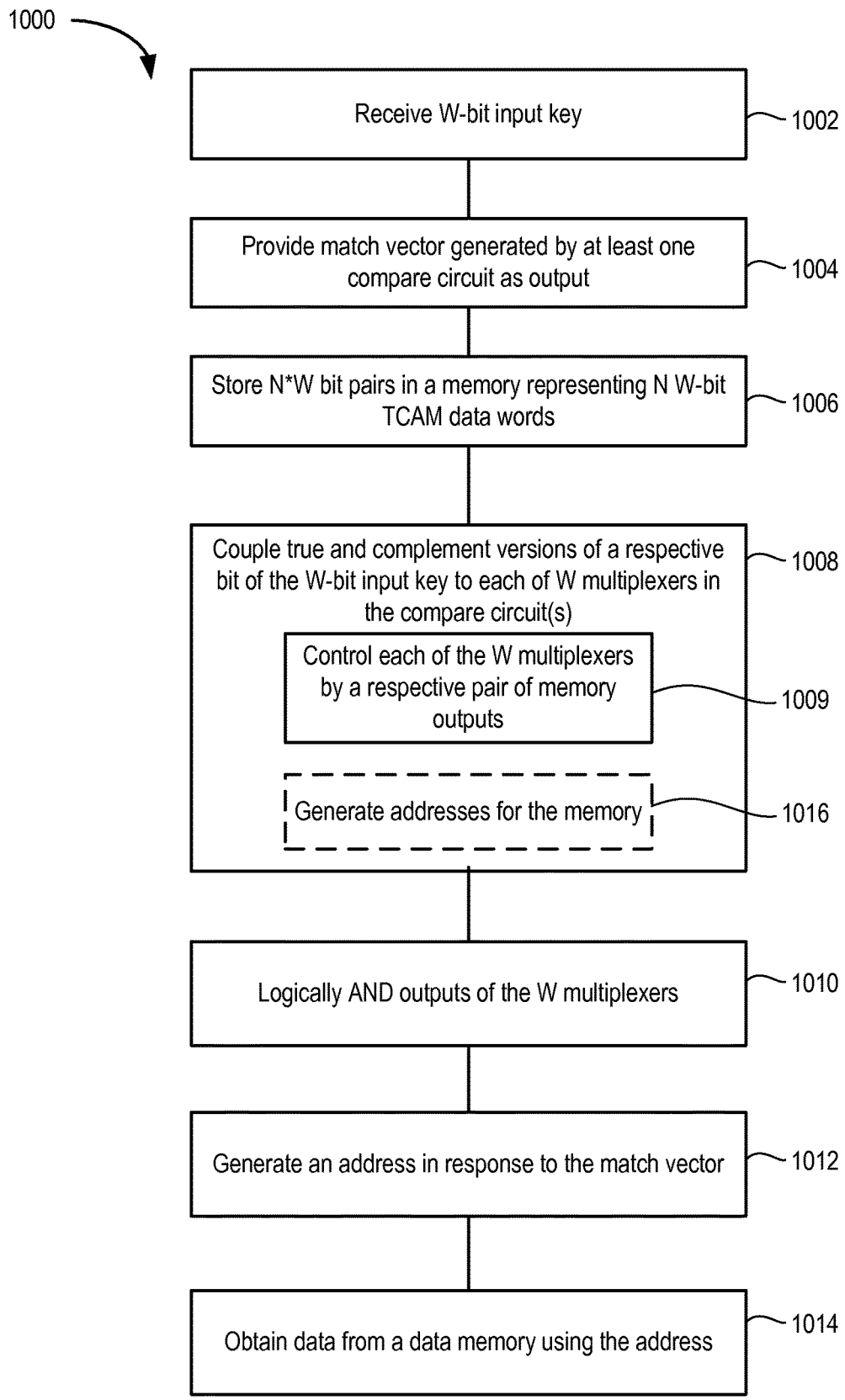
FIG. 10 is a flow diagram depicting an example of a method of implementing a TCAM.

FIG. 10 is a flow diagram depicting an example of a method 1000 of implementing a TCAM. The operations in method 1000 do not implicate any particular order. The method 1000 begins at operation 1002, where a W-bit key is received as input. At operation 1004, an match vector generated by at least one compare circuit is provided as output. The match vector can include at least one bit. In an example, the at least one compare circuit can be configured in a programmable IC.

At operation 1006, N*W bit pairs are stored in a memory that represent N W-bit TCAM words. As described above, the memory can be configuration memory of a programmable IC or distributed RAM in a programmable IC. In some examples, the memory can be an addressable RAM.

At operation 1008, a true version and a complement version of a respective bit of the W-bit input key is coupled to each of W multiplexers in the at least one compare circuits. At operation 1009, each of the W multiplexers is controlled by a respective pair of outputs of the memory. At an optional operation 1016, addresses are generated for the memory. At operation 1010, the outputs of the W multiplexers are logically ANDed.

The method 1000 can include an operation 1012, where an address is generated in response to the match vector. At operation 1014, data is obtained from a data memory using the address.

While the foregoing is directed to specific examples, other and further examples may be devised without departing from the basic scope thereof, and the scope thereof is determined by the claims that follow.

What is claimed is:

1. A ternary content addressable memory (TCAM) circuit, comprising:
    an input port coupled to receive a W-bit key as input, where W is an integer greater than zero and is a width of the TCAM circuit;
    an output port coupled to provide a match vector as output, the match vector comprising at least one bit;
    a memory having memory cells operable to store N*W pairs of bits for N W-bit TCAM words, where N is an integer greater than zero and is a depth of the TCAM circuit, the memory including a plurality of memory outputs;
    at least one compare circuit comprising:
        at least one multiplexer each coupled to receive as input a true version and a complement version of a bit of the W-bit key, each of the at least one multiplexer controlled by a pair of memory outputs of the plurality of memory outputs; and
        combinatorial logic coupled to perform at least one logical AND operation based on an output of the at least one multiplexer.

2. The TCAM circuit of claim 1, wherein each of the at least one multiplexer comprises a four-input multiplexer having a first input coupled to receive the true version of a respective bit of the W-bit key, a second input coupled to receive the complement version of the respective bit of the W-bit key, a third input that is unconnected or coupled to receive a constant logic high bit, and a fourth input coupled to receive the constant logic high bit.

3. The TCAM circuit of claim 1, wherein the at least one compare circuit comprises N compare circuits, wherein the at least one multiplexer comprises N*W multiplexers, wherein each of the N compare circuits includes W of the N*W multiplexers, and wherein the pair of memory outputs controlling each of the N*W multiplexers is coupled to a respective pair of the memory cells.

4. The TCAM circuit of claim 1, wherein the at least one compare circuit comprises a single compare circuit, wherein the at least one multiplexer comprises W multiplexers in the single compare circuit, wherein the plurality of memory outputs comprises 2*W memory outputs, wherein the pair of memory outputs controlling each of the W multiplexers is coupled a respective pair of the 2*W memory outputs, and wherein the TCAM circuit further comprises:
    an address generator coupled to the memory.

5. The TCAM circuit of claim 1, wherein the at least one compare circuit comprises N compare circuits, wherein the at least one multiplexer comprises N multiplexers, wherein each of the N compare circuits includes a respective one of the N multiplexers, wherein the plurality of memory outputs comprises 2*N memory outputs, wherein the pair of memory outputs controlling each of the N multiplexers is coupled to a respective pair of the 2*N memory outputs, and wherein the TCAM circuit further comprises:
    an address generator coupled to the memory.

6. The TCAM circuit of claim 1, further comprising:
    a priority encoder coupled to the output port to receive the match vector.

7. The TCAM circuit of claim 6, further comprising:
    a data memory having an address port coupled to the priority encoder;
    wherein the priority encoder is operable to generate an address for the data memory based on the match vector.

8. The TCAM circuit of claim 1, wherein the at least one multiplexer comprises at least a portion of a plurality of multiplexers in an interconnect tile of a programmable integrated circuit (IC), and wherein the combinatorial logic is implemented by lookup-table (LUT) logic in the programmable IC.

9. The TCAM circuit of claim 8, wherein the memory cells comprise a portion of a configuration memory of the programmable IC.

10. The TCAM circuit of claim 8, wherein the memory cells comprise a portion of a distributed memory in the programmable IC.

11. A method of implementing a ternary content addressable memory (TCAM), comprising:
    receiving a W-bit key as input, where W is an integer greater than zero and is a width of the TCAM;
    providing a match vector as output, the match vector comprising at least one bit generated by at least one compare circuit;
    storing N*W pairs of bits for N W-bit TCAM words in memory cells of a memory, where N is an integer greater than zero and is the depth of the TCAM, the memory including a plurality of memory outputs;
    coupling a true version and a complement version of a bit of the W-bit key to each of at least one multiplexer in the at least one compare circuit, each of the at least one multiplexer controlled by a respective pair of memory outputs of the plurality of memory outputs; and
    performing at least one AND operation based on an output of the at least one multiplexer.

12. The method of claim 11, wherein each of the at least one multiplexer comprises a four-input multiplexer having a first input coupled to receive the true version of a respective bit of the W-bit key, a second input coupled to receive the complement version of the respective bit of the W-bit key, a third input that is unconnected or coupled to receive a constant logic high bit, and a fourth input coupled to receive the constant logic high bit.

13. The method of claim 11, further comprising:
   generating an address in response to the match vector; and
   obtaining data from a data memory using the address.

14. The method of claim 11, wherein the memory cells comprise a portion of a configuration memory of the programmable IC.

15. The method of claim 11, wherein the memory cells comprise a portion of a distributed memory in the programmable IC.

* * * * *